(12) United States Patent
Yamaguchi et al.

(10) Patent No.: US 11,060,770 B2
(45) Date of Patent: Jul. 13, 2021

(54) COOLING SYSTEM

(71) Applicant: Tokyo Electron Limited, Tokyo (JP)

(72) Inventors: Shin Yamaguchi, Miyagi (JP); Akiyoshi Mitsumori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 178 days.

(21) Appl. No.: 16/273,354

(22) Filed: Feb. 12, 2019

(65) Prior Publication Data

US 2019/0249911 A1 Aug. 15, 2019

(30) Foreign Application Priority Data

Feb. 13, 2018 (JP) .............................. JP2018-022895

(51) Int. Cl.
*F28D 5/00* (2006.01)
*F25B 39/02* (2006.01)
*H01L 21/67* (2006.01)
*F25B 41/20* (2021.01)
*H01L 21/683* (2006.01)
*F25B 1/00* (2006.01)

(52) U.S. Cl.
CPC ............ *F25B 39/028* (2013.01); *F25B 41/20* (2021.01); *F28D 5/00* (2013.01); *H01L 21/67017* (2013.01); *H01L 21/67109* (2013.01); *F25B 1/00* (2013.01); *H01L 21/6833* (2013.01)

(58) Field of Classification Search
CPC .. F25B 1/00; F25B 2400/06; F25B 2400/075; F25B 39/028; F25B 41/04; F25B 5/02; F28D 5/00; H01L 21/67017; H01L 21/67109; H01L 21/6833
See application file for complete search history.

(56) References Cited

U.S. PATENT DOCUMENTS

| 2005/0133157 A1* | 6/2005 | Choi ................. H01L 21/67248 156/345.27 |
| 2006/0285270 A1* | 12/2006 | Lee .................. H01L 21/67109 361/234 |

(Continued)

FOREIGN PATENT DOCUMENTS

| JP | 2008-186856 A | 8/2008 |
| JP | 2012-028811 A | 2/2012 |

(Continued)

*Primary Examiner* — Filip Zec
(74) *Attorney, Agent, or Firm* — Pearne & Gordon LLP

(57) ABSTRACT

A cooling system configured to circulate a coolant under a placing surface of a placing table includes a heat exchange unit within the placing table and configured to perform a heat exchange by the coolant via the placing surface; a chiller unit connected to the heat exchange unit. The heat exchange unit comprises a reservoir chamber configured to store the coolant; and an evaporation chamber configured to evaporate the coolant stored in the reservoir chamber. The reservoir chamber is connected to the chiller unit and communicates with the evaporation chamber. The evaporation chamber is connected to the chiller unit, extended along the placing surface and includes discharge holes. The discharge holes are arranged such that the coolant is discharged toward a heat transfer wall as a placing surface-side inner wall of the evaporation chamber. The discharge holes are dispersed within the placing surface.

8 Claims, 14 Drawing Sheets

(56) References Cited

U.S. PATENT DOCUMENTS

| | | | | |
|---|---|---|---|---|
| 2008/0203925 A1* | 8/2008 | Tandou | ............ | H01L 21/67109 |
| | | | | 315/111.21 |
| 2008/0268645 A1* | 10/2008 | Kao | ................ | H01J 37/32568 |
| | | | | 438/694 |
| 2009/0095097 A1* | 4/2009 | Wadell | ................ | G01R 31/311 |
| | | | | 73/866.5 |
| 2009/0118872 A1* | 5/2009 | Nonaka | ............. | G05D 23/1934 |
| | | | | 700/285 |
| 2010/0025372 A1* | 2/2010 | Tsujimoto | ........... | H01L 21/6833 |
| | | | | 216/71 |
| 2014/0231012 A1* | 8/2014 | Hinode | ............ | H01L 21/67248 |
| | | | | 156/345.23 |
| 2016/0104605 A1* | 4/2016 | Hiroki | ............... | H01J 37/32532 |
| | | | | 62/160 |
| 2016/0372340 A1* | 12/2016 | Takeaki | ............ | H01L 21/67109 |

FOREIGN PATENT DOCUMENTS

| | | |
|---|---|---|
| JP | 2013-077859 A | 4/2013 |
| JP | 2015-520943 A | 7/2015 |
| JP | 2015-144242 A | 8/2015 |
| WO | 2013/162973 A1 | 10/2013 |

\* cited by examiner

|  | FCV-1 | ... | FCV-n | TOTAL |
|---|---|---|---|---|
| T1 | 30% | ... | 10% | 100% |
| T2 | 20% | ... | 5% | 100% |
| ... | ... | ... | ... | 100% |

PT2:

|  | FCV-1 | ... | FCV-n | TOTAL |
|---|---|---|---|---|
| T1 | 50% | ... | 20% | 100% |
| ... | 50% | ... | 20% | 100% |

PT3:

|  | FCV-1 | ... | FCV-n | TOTAL |
|---|---|---|---|---|
| T1 | 100% | ... | 0% | 100% |
| T2 | 0% | ... | 100% | 100% |
| ... | ... | ... | ... | 100% |

COOLING SYSTEM

CROSS-REFERENCE TO RELATED APPLICATION

This application claims the benefit of Japanese Patent Application No. 2018-022895 filed on Feb. 13, 2018, the entire disclosure of which is incorporated herein by reference.

TECHNICAL FIELD

The various aspects and embodiments described herein pertain generally to a cooling system.

BACKGROUND

When performing a processing such as film formation or etching on a processing target object such as a wafer by plasma processing in a semiconductor manufacturing apparatus, a temperature of the processing target object needs to be adjusted during the processing. Patent Documents 1 to 5 disclose techniques of adjusting the temperature of the processing target object. For example, the semiconductor manufacturing apparatus has a placing table configured to support the processing target object within a processing vessel which can be decompressed. Such a placing table has a function of adjusting the temperature of the processing target object by using, for example, a coolant.

Patent Document 1: Japanese Patent Laid-open Publication No. 2015-144242
Patent Document 2: Japanese Patent Laid-open Publication No. 2015-520943
Patent Document 3: Japanese Patent Laid-open Publication No. 2013-077859
Patent Document 4: Japanese Patent Laid-open Publication No. 2012-028811
Patent Document 5: Japanese Patent Laid-open Publication No. 2008-186856

A path for the coolant provided in the placing table may have, for example, a long bent shape within the placing table. Due to this shape of the path within the placing table, there may be generated a pressure difference between an inlet port and an output port of the coolant, and this pressure difference may result in non-uniformity in heat release through the coolant depending on positions within a surface of the placing table. As a result, the temperature adjustment within the processing target object placed on the placing table may not be performed effectively. In view of this, there is a demand for a technique capable of reducing the in-surface non-uniformity in the heat release upon the processing target object placed on the surface of the placing table.

SUMMARY

In an exemplary embodiment, there is provided a cooling system configured to circulate a coolant under a placing surface of a placing table on which a processing target object is placed. The cooling system includes a heat exchange unit provided within the placing table and configured to perform a heat exchange by the coolant via the placing surface of the placing table; a supply line and a first drain line connected to the heat exchange unit; and a chiller unit connected to the heat exchange unit via the supply line and the first drain line. The heat exchange unit comprises a reservoir chamber configured to store the coolant supplied from the chiller unit via the supply line, and an evaporation chamber configured to evaporate the coolant stored in the reservoir chamber. The reservoir chamber is connected to the chiller unit via the supply line and communicates with the evaporation chamber via multiple pipes. The evaporation chamber is connected to the chiller unit via the first drain line, extended along the placing surface and includes multiple discharge holes. The multiple discharge holes are respectively provided at one ends of the multiple pipes and arranged such that the coolant is discharged from the multiple pipes toward a heat transfer wall which is an inner wall of the evaporation chamber at a side of the placing surface. The multiple discharge holes are provided to be dispersed within the placing surface, when viewed from above the placing surface.

Since the multiple discharge holes from which the coolant is discharged to the heat transfer wall of the heat exchange unit are provided to be dispersed within the placing surface when viewed from above the placing surface, the coolant can be uniformly discharged toward the heat transfer wall regardless of place, when viewed from above the placing surface. Therefore, the in-surface non-uniformity in the heat release upon the processing target object placed on the placing surface can be reduced.

The first drain line is connected to a liquid accumulation region which is extended downwards below the multiple discharge holes in the evaporation chamber. Since the first drain line is connected to a side of the bottom wall of the evaporation chamber, the coolant accumulated on the bottom wall can be efficiently collected.

The evaporation chamber includes first branch chambers spaced apart from each other within the placing table. The reservoir chamber includes second branch chambers spaced apart from each other within the placing table. The first branch chambers respectively includes the multiple discharge holes and are provided to be dispersed within the placing surface when viewed from above the placing surface. The second branch chambers communicate with the first branch chambers via the multiple pipes, respectively. The first drain line includes first branch lines. The first branch lines are respectively connected to the first branch chambers. The supply line includes second branch lines. The second branch lines are respectively connected to the second branch chambers. Since the evaporation chamber and the reservoir chamber are respectively divided into the multiple branch chambers which are spaced apart from each other and the multiple branch chambers are provided to be dispersed within the placing surface when viewed from above the placing surface, the in-surface non-uniformity in the heat release upon the processing target object placed on the placing surface can be reduced.

The cooling system further includes multiple valves respectively provided at the second branch lines; and a control unit configured to control a flow rate of the coolant supplied into each of the second branch chambers by adjusting an openness degree of each of the multiple valves. Since the flow rates of the coolant supplied into the respective branch chambers of the reservoir chamber can be adjusted individually, the heat release upon the processing target object is accurately controlled place by place. Accordingly, the in-surface non-uniformity in the heat release upon the processing target object can be further reduced.

The cooling system further includes a second drain line. The second drain line connects the evaporation chamber with the chiller unit, and is connected to a gas diffusion space extended above the multiple discharge holes in the evaporation chamber. Since the vaporized coolant has a reduced heat transfer coefficient and mostly does not contribute to the heat exchange, this evaporated coolant may be a factor hampering the heat exchange if it stays. Thus, it is desirable that the vaporized coolant is discharged promptly. Accordingly, since the second drain line is provided at a side of the heat transfer wall of the evaporation chamber, the vapor of the coolant existing around the heat transfer wall can be collected rapidly.

The chiller unit includes multiple chiller units. Each of the multiple chiller units is configured to supply the coolant into and drain the coolant from a single set of the corresponding one of the second branch chambers and the corresponding one of the first branch chambers communicating with each other. As stated above, since the chiller units are respectively provided for the branch chambers of the evaporation chamber and the reservoir chamber and the circulation of the coolant can be performed by the individual chiller units independently, the heat release upon the processing target object can be more accurately controlled place by place.

As stated above, it is possible to provide a technique capable of reducing the in-surface non-uniformity in the heat release upon the processing target object placed on the surface of the placing table.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 9 is a diagram for describing an example of an operation of the cooling system shown in FIG. 6;

DETAILED DESCRIPTION

Figure 1:
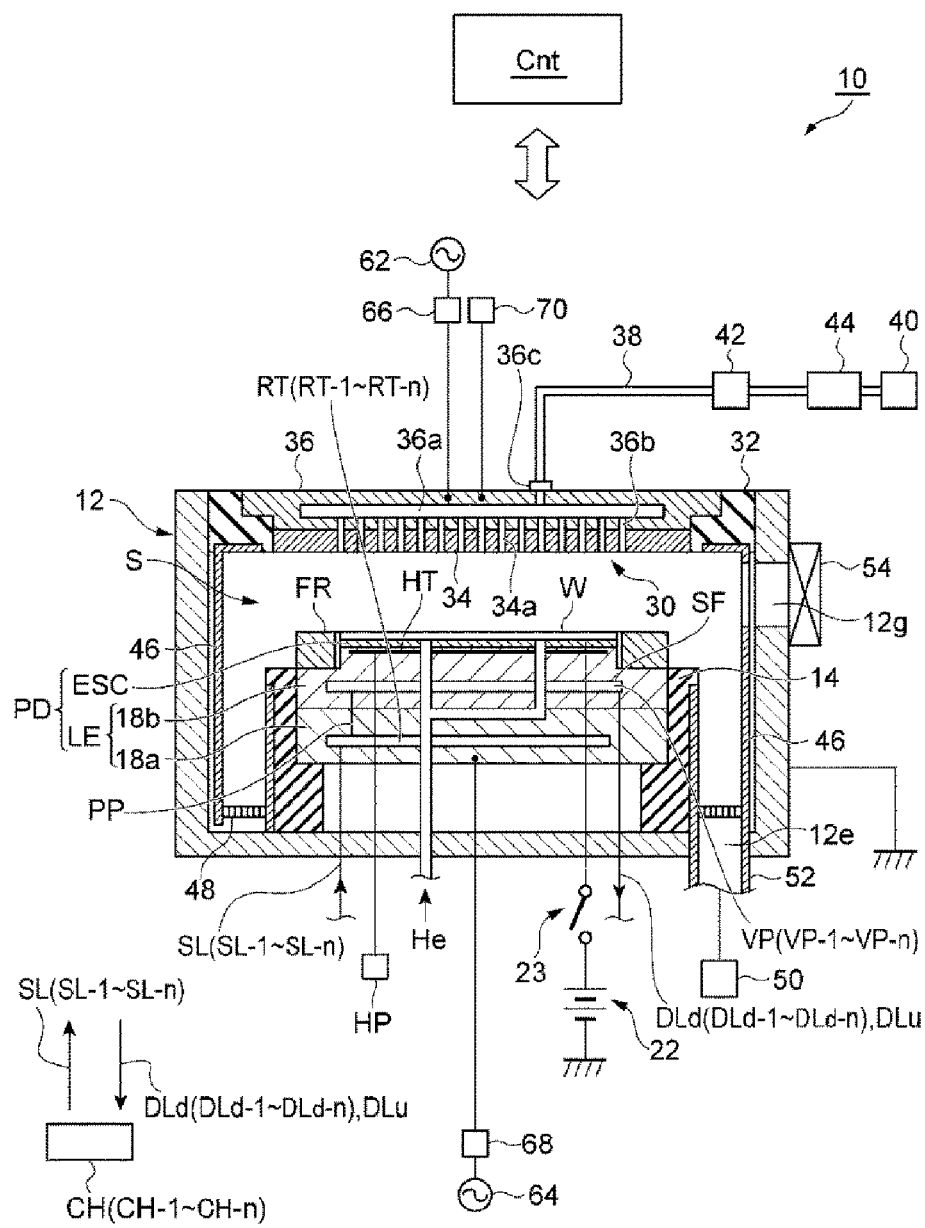
FIG. 1 is a diagram schematically illustrating an example of a configuration of a plasma processing apparatus to which a cooling system according to the present disclosure is applied.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereafter, a cooling system (hereinafter, referred to as "cooling system CS") according to various exemplary embodiments will be described in detail with reference to the accompanying drawings. The cooling system CS is configured to circulate a coolant under a placing surface (referred to as "placing surface FA") of a placing table (referred to as "placing table PD") on which a processing target object (referred to as "wafer W") is placed. Further, in the various drawings, same or corresponding parts will be assigned same reference numerals.

In the following, cooling systems CS according to a first exemplary embodiment to a fifth exemplary embodiment will be explained. The cooling systems CS according to the first exemplary embodiment to the fifth exemplary embodiment can be used in a plasma processing apparatus 10 shown in FIG. 1. First, referring to FIG. 1, a configuration of the plasma processing apparatus 10 to which the cooling systems CS according to the first exemplary embodiment to the fifth exemplary embodiment are applicable will be explained. FIG. 1 is a diagram schematically illustrating an example of the configuration of the plasma processing apparatus 10 to which the cooling system CS of the present disclosure is applied.

The plasma processing apparatus 10 shown in FIG. 1 is a plasma etching apparatus equipped with a parallel plate type electrode, and has a processing vessel 12. The processing vessel 12 has, for example, a cylindrical shape. The processing vessel 12 is made of, by way of non-limiting example, aluminum, and an inner wall surface of the processing vessel 12 is anodically oxidized. The processing vessel 12 is frame-grounded.

A substantially cylindrical supporting member 14 is provided on a bottom portion of the processing vessel 12. The supporting member 14 is made of, by way of example, but not limitation, an insulating material. The insulating material forming the supporting member 14 may contain oxygen, such as quartz. Within the processing vessel 12, the supporting member 14 is vertically extended from the bottom portion of the processing vessel 12 (toward an upper electrode 30).

A placing table PD is provided within the processing vessel 12. The placing table PD is supported by the supporting member 14. The placing table PD is configured to hold a wafer W on a top surface of the placing table PD. The placing table PD includes a lower electrode LE and an electrostatic chuck ESC.

The lower electrode LE is provided with a first plate 18a and a second plate 18b. The first plate 18a and the second plate 18b are made of a metal such as, but not limited to, aluminum, and have a substantially disk shape. The second plate 18b is provided on the first plate 18a and electrically connected with the first plate 18a. The electrostatic chuck ESC is provided on the second plate 18b.

The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

Figure 2:
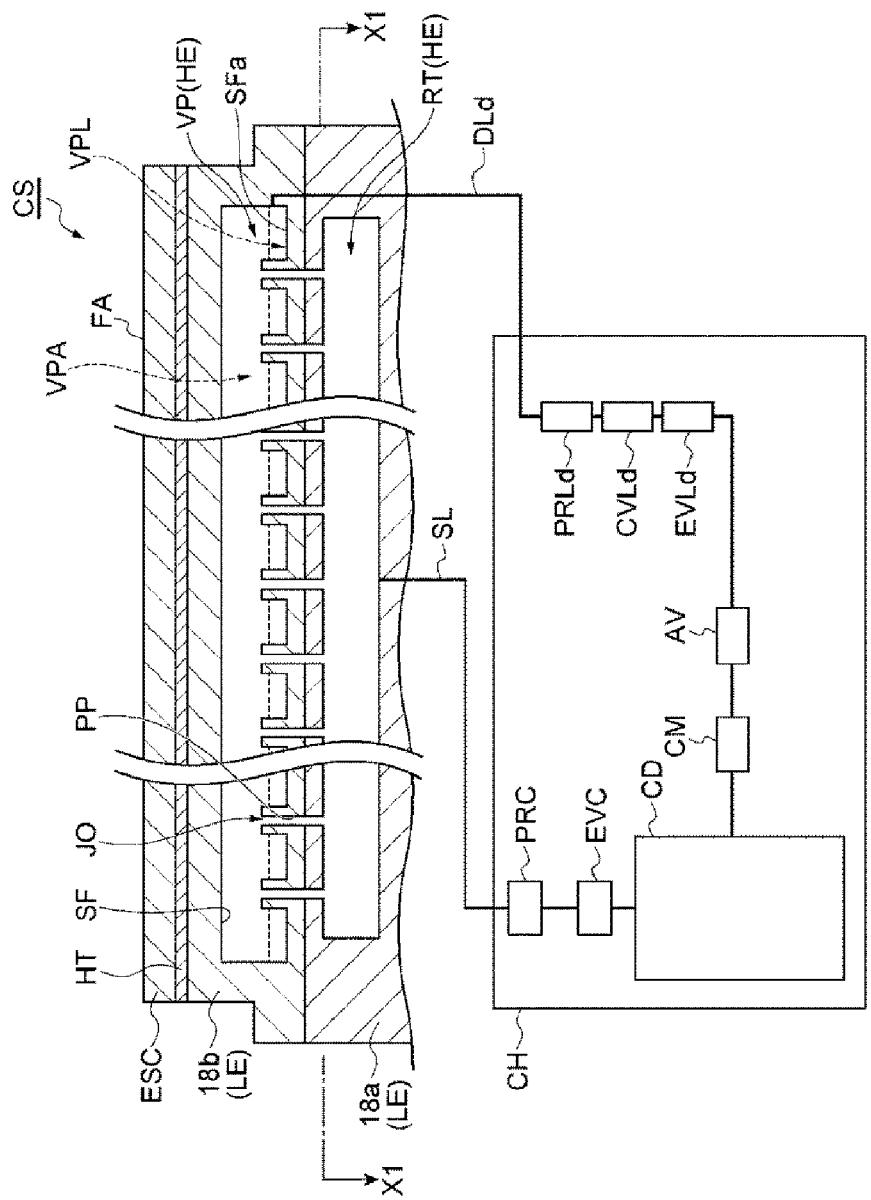
FIG. 2 is a diagram illustrating a configuration (first exemplary embodiment) of the cooling system according to the present disclosure.
Figure 10:
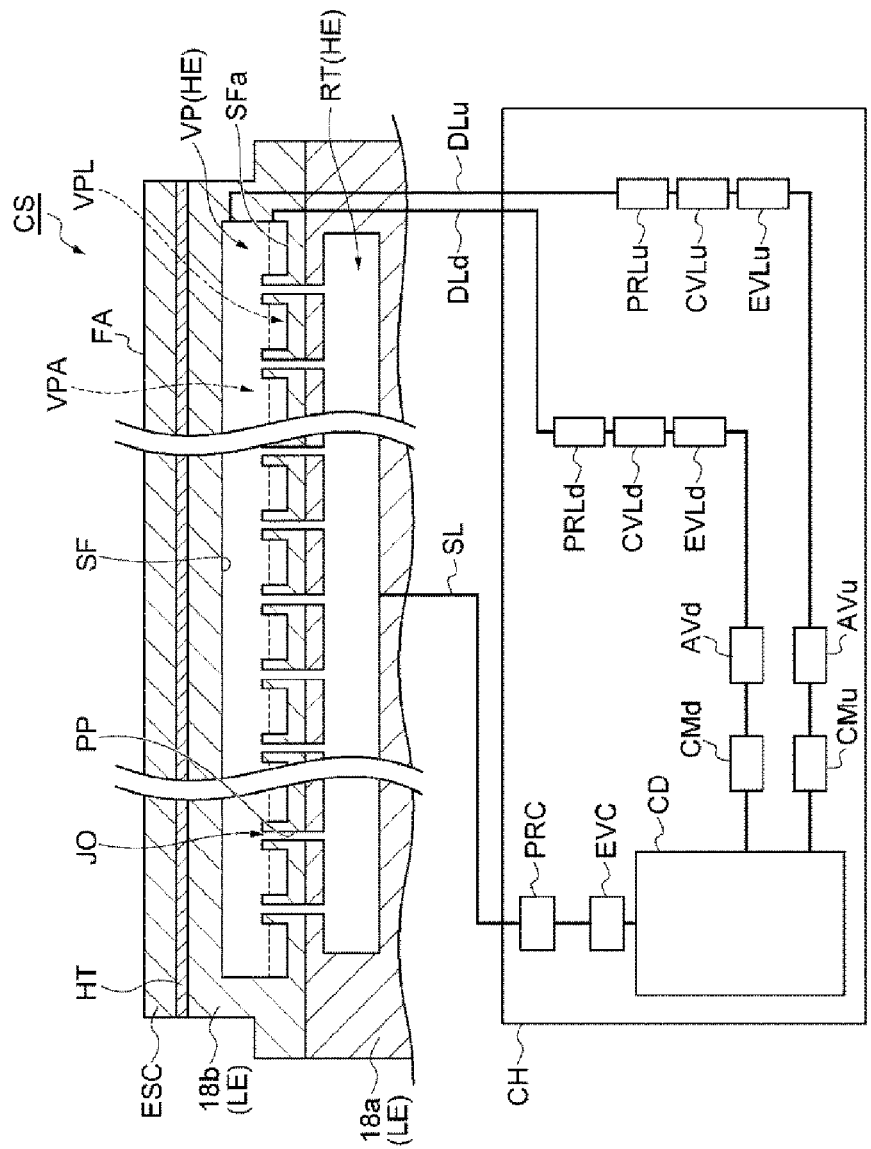
FIG. 10 is a diagram illustrating yet another configuration (third exemplary embodiment) of the cooling system according to the present disclosure.

An evaporation chamber VP shown in FIG. 2 and FIG. 10 (or branch chambers VP-1 to VP-n shown in FIG. 6, FIG. 11 and FIG. 13) is provided within the second plate 18b. A heat transfer wall SF of the evaporation chamber VP evaporate a coolant, so that a temperature of the electrostatic chuck ESC on the heat transfer wall SF of the evaporation chamber VP is lowered. Accordingly, the evaporation chamber VP is capable of cooling the wafer W placed on the electrostatic chuck ESC. A reservoir chamber RT shown in FIG. 2 and FIG. 10 (or branch chambers RT-1 to RT-n shown in FIG. 6, FIG. 11 and FIG. 13) is provided within the first plate 18a. The reservoir chamber RT stores therein the coolant which is supplied to the evaporation chamber VP.

Further, in the present specification, a phase change from a solid or a liquid into a gas is referred to as "vaporization," and the vaporization taking place only on a surface of the solid or the liquid is referred to as "evaporation." Further, the vaporization taking place from the inside of the liquid is referred to as "boiling." When the coolant is discharged to be come into contact with the heat transfer wall, the coolant evaporates from the liquid phase into the gas phase. At this moment, a caloric power called latent heat or heat of vaporization is transferred from the heat transfer wall to the coolant.

Figure 13:
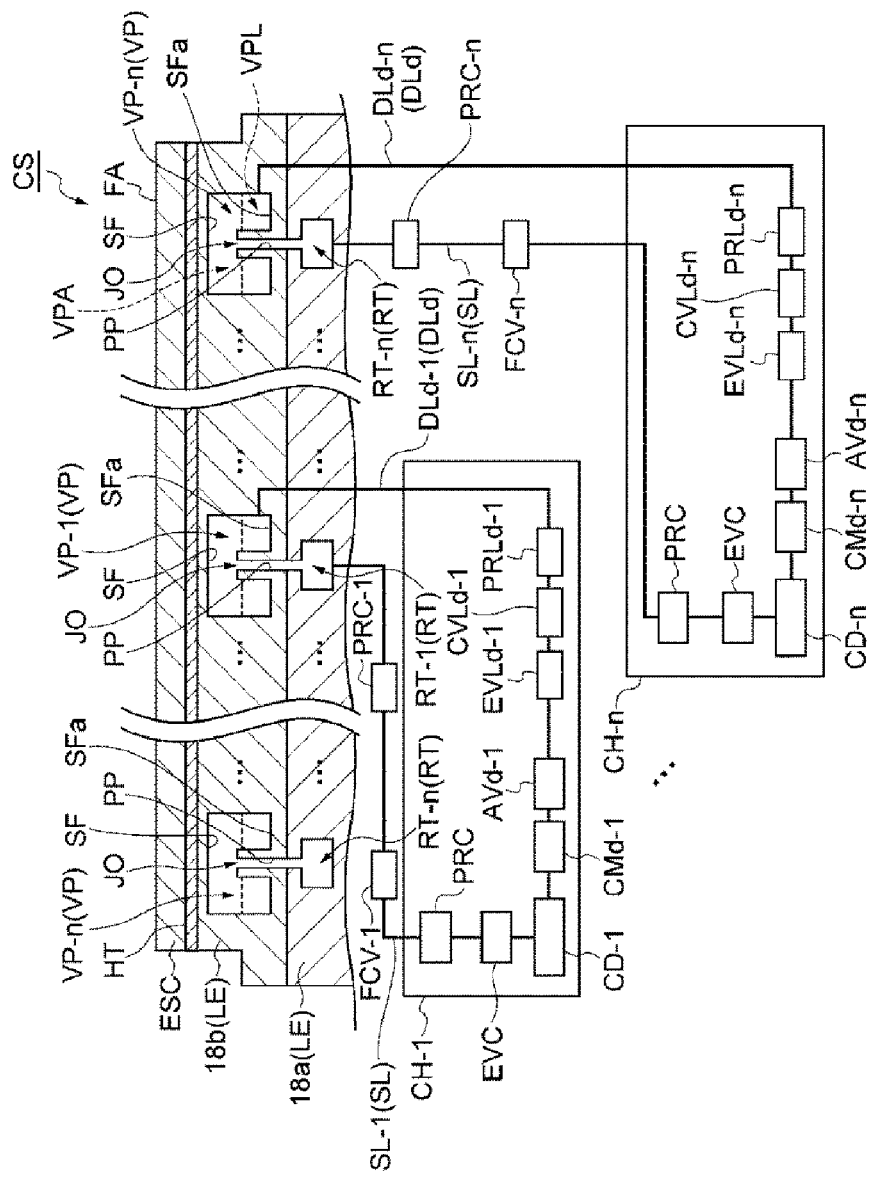
FIG. 13 is a diagram illustrating still yet another configuration (fifth exemplary embodiment) of the cooling system according to the present disclosure.

The plasma processing apparatus 10 includes a chiller unit CH shown in FIG. 2, FIG. 10, FIG. 6 and FIG. 11 (or chiller units CH-1 to CH-n shown in FIG. 13). The chiller unit CH is configured to cool the wafer W placed on the electrostatic chuck ESC by circulating the coolant via a supply line SL, the reservoir chamber RT, the evaporation chamber VP and a drain line DLd to lower the temperature of the electrostatic chuck ESC.

Figure 6:
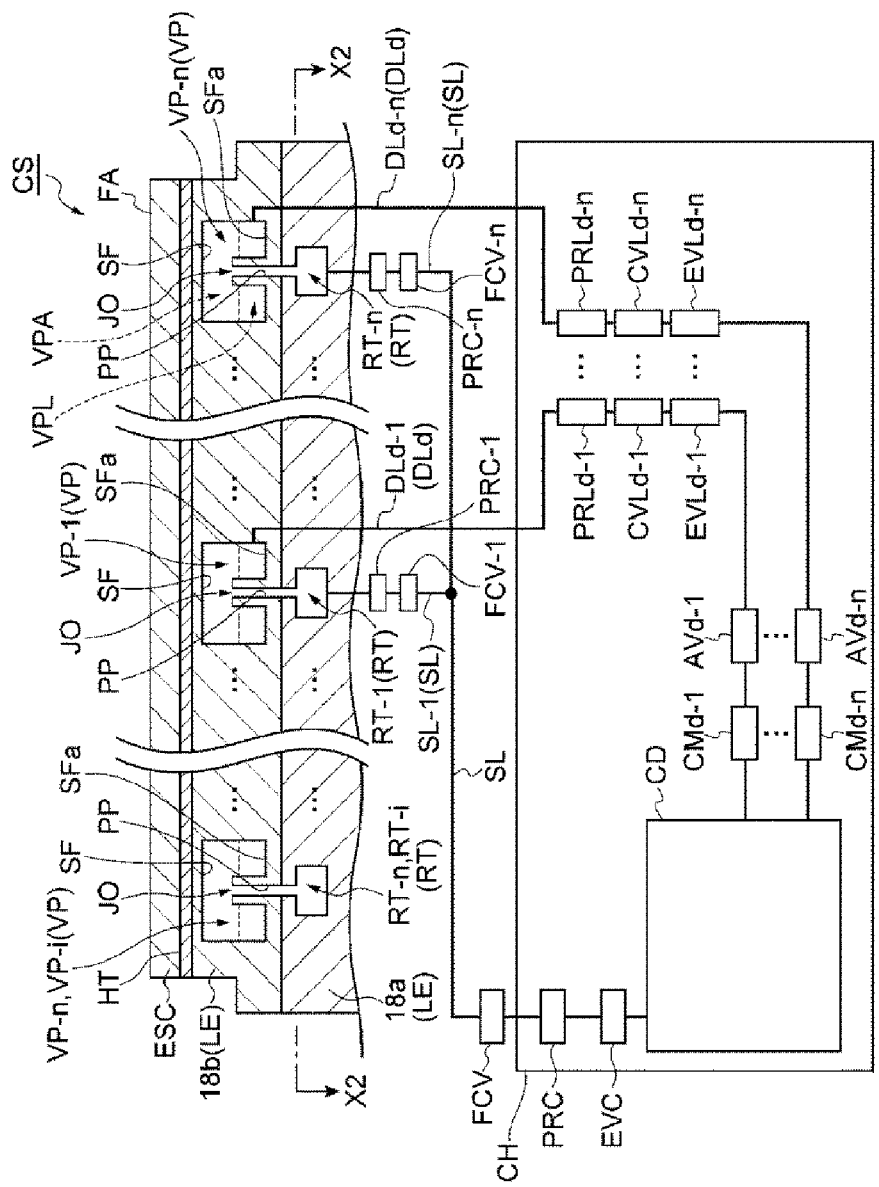
FIG. 6 is a diagram illustrating another configuration (second exemplary embodiment) of the cooling system according to the present disclosure.
Figure 11:
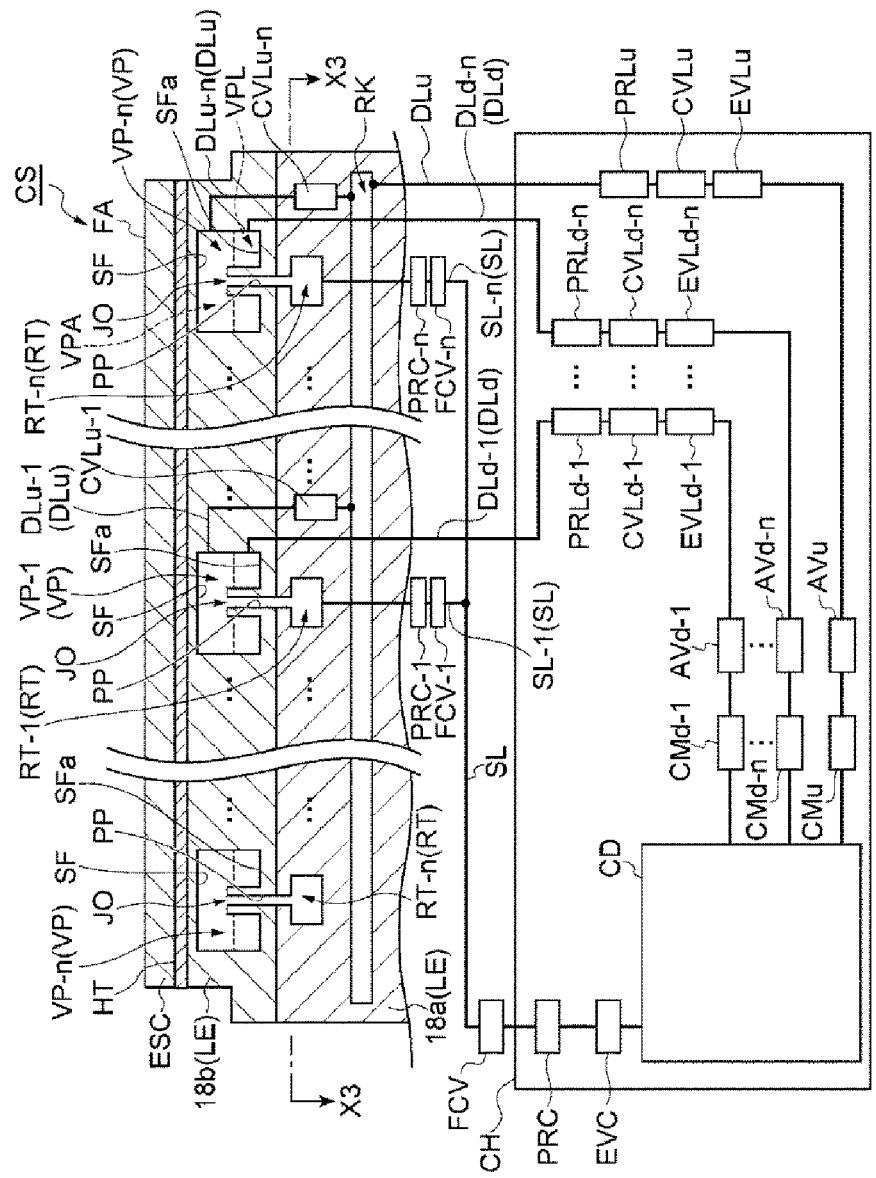
FIG. 11 is a diagram illustrating still yet another configuration (fourth exemplary embodiment) of the cooling system according to the present disclosure.

The coolant is supplied into the reservoir chamber RT from the chiller unit CH via the supply line SL (or branch lines SL-1 to SL-n shown in FIG. 6, FIG. 11 and FIG. 13). The coolant is drained into the chiller unit CH from the evaporation chamber VP via the drain line DLd (or branch lines DLd-1 to DLd-n shown in FIG. 6, FIG. 11 and FIG. 13 and a drain line DLu shown in FIG. 10 and FIG. 11).

The plasma processing apparatus 10 includes a cooling system CS equipped with the aforementioned evaporation chamber VP, the reservoir chamber RT and the chiller unit CH. A specific configuration of the cooling system CS will be described later.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

The plasma processing apparatus 10 is provided with a heater HT as a heating element. The heater HT is embedded in, for example, the second plate 18b. The heater HT is connected to a heater power supply HP.

As a power is supplied to the heater HT from the heater power supply HP, a temperature of the placing table PD is adjusted, and, ultimately, a temperature of the wafer W placed on the placing table PD is adjusted. Further, the heater HT may be embedded in the electrostatic chuck ESC.

The plasma processing apparatus 10 includes an upper electrode 30. The upper electrode 30 is provided above the placing table PD, facing the placing table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. The insulating shield member 32 may be made of an insulating material, such as quartz, containing oxygen. The upper electrode 30 may include an electrode plate 34 and an electrode supporting body 36.

The electrode plate 34 is directly contacted with the processing space S, and is provided with multiple gas discharge holes 34a. In an exemplary embodiment, the electrode plate 34 contains silicon. In other exemplary embodiments, the electrode plate 34 may contain silicon oxide.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36.

Multiple gas through holes 36b are extended downwards from the gas diffusion space 36a (toward the placing table PD), and these gas through holes 36b communicate with the gas discharge holes 34a, respectively. The electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources.

The valve group 42 includes a plurality of valves, and the flow rate controller group 44 includes a plurality of flow rate controllers such as mass flow controllers. Each of the gas sources belonging to the gas source group 40 is connected to the gas supply line 38 via a corresponding valve belonging to the valve group 42 and a corresponding flow rate controller belonging to the flow rate controller group 44.

With this configuration, the plasma processing apparatus 10 is capable of supplying gases from one or more gas sources selected from the plurality of gas sources belonging to the gas source group 40 into the processing vessel 12 at individually controlled flow rates.

In the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$. The deposition shield may be made of, besides the $Y_2O_3$, an oxygen-containing material such as, but not limited to, quartz.

At a side of the bottom portion of the processing vessel 12 (a side where the supporting member 14 is provided), a gas exhaust plate 48 is provided between the supporting member 14 and a sidewall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52.

The gas exhaust device 50 includes a vacuum pump such as a turbo molecular pump, and is capable of decompressing a space within the processing vessel 12 to a required vacuum level. Further, a carry-in/out opening 12g for the wafer W is provided at the side wall of the processing vessel 12, and the carry-in/out opening 12g is opened or closed by a gate valve 54.

The plasma processing apparatus 10 further includes a first high frequency power supply 62 and a second high frequency power supply 64. The first high frequency power supply 62 is configured to generate a first high frequency power for plasma generation having a frequency ranging from 27 MHz to 100 MHz, for example, 60 MHz. The first high frequency power supply 62 is connected to the upper electrode 30 via a matching device 66. The matching device 66 is a circuit configured to match an output impedance of the first high frequency power supply 62 and an input impedance at a load side (lower electrode LE side). Further, the first high frequency power supply 62 may be connected to the lower electrode LE via the matching device 66.

The second high frequency power supply 64 is configured to generate a second high frequency power for ion attraction into the wafer W, that is, a high frequency bias power having a frequency ranging from 400 kHz to 40.68 MHz, for example, 13.56 MHz. The second high frequency power supply 64 is connected to the lower electrode LE via a matching device 68. The matching device 68 is a circuit configured to match an output impedance of the second high frequency power supply 64 and the input impedance at the load side (lower electrode LE).

The plasma processing apparatus 10 is further equipped with a power supply 70. The power supply 70 is connected to the upper electrode 30. The power supply 70 is configured to apply, to the upper electrode 30, a voltage for attracting positive ions existing in the processing space S into the electrode plate 34. As an example, the power supply 70 may be a DC power supply configured to generate a negative DC voltage. If such a voltage is applied to the upper electrode 30 from the power supply 70, the positive ions existing in the processing space S collide with the electrode plate 34. Accordingly, secondary electrons and/or silicon may be released from the electrode plate 34.

In the present disclosure, the plasma processing apparatus 10 may further include a control unit Cnt. The control unit Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP and the chiller unit CH (or the chiller units CH-1 to CH-n).

The control unit Cnt may control, by using control signals, selection and a flow rate of the gas supplied from the gas source group 40, the gas exhaust by the gas exhaust device 50, the power supplies from the first high frequency power supply 62 and the second high frequency power supply 64, the voltage application from the power supply 70, the power supply from the heater power supply HP, a flow rate of a coolant supplied from the chiller unit CH (or the chiller units CH-1 to CH-n) to the evaporation chamber VP, and so forth.

The control unit Cnt is equipped with a CPU, a ROM, a RAM, and so forth, and the CPU executes a computer program stored in a memory device such as the ROM or the RAM. This computer program includes a program for allowing the CPU to perform a function of controlling an overall operation of the plasma processing apparatus 10. Particularly, this computer program includes a program for allowing the CPU of the control unit Cnt to implement a recipe according to the plasma processing performed in the plasma processing apparatus 10.

First Exemplary Embodiment

FIG. 2 is a diagram illustrating a configuration of a cooling system CS according to the first exemplary embodiment. The cooling system CS includes the chiller unit CH, the supply line SL, the drain line DLd (first drain line), a heat exchange unit HE.

The heat exchange unit HE is equipped with the evaporation chamber VP, the reservoir chamber RT and multiple pipes PP. Each pipe PP has a discharge hole JO. The heat exchange unit HE is provided within the placing table PD and configured to perform heat exchange through the coolant via the placing surface FA of the placing table PD.

The reservoir chamber RT stores therein the coolant which is supplied from the chiller unit CH via the supply line SL. The reservoir chamber RT is connected to the chiller unit CH via the supply line SL and is allowed to communicate with the evaporation chamber VP via the multiple pipes PP.

The evaporation chamber VP evaporates the coolant stored in the reservoir chamber RT. The evaporation chamber VP is connected to the chiller unit CH via the drain line DLd, extended along the placing surface FA of the placing table PD and includes the multiple discharge holes JO. The discharge holes JO are respectively provided at one ends of the pipes PP and arranged such that the coolant is discharged toward, among inner walls of the evaporation chamber VP, the heat transfer wall SF at the placing surface FA side from the pipes PP.

Figure 3:
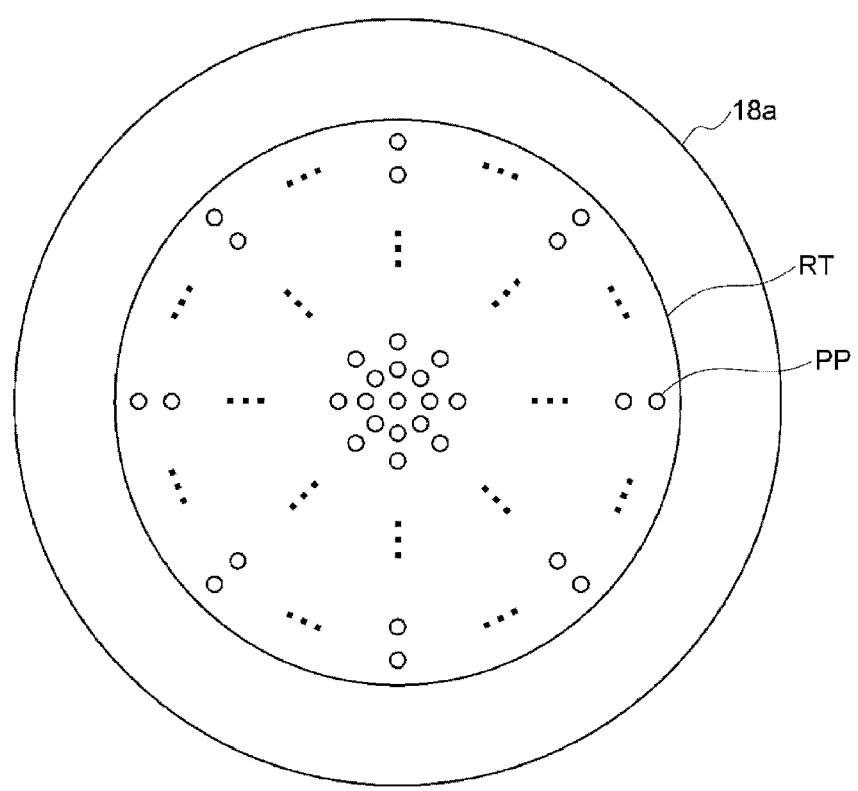
FIG. 3 is a diagram showing an example of a cross section of a lower electrode taken along a line X1-X1 of FIG. 2.

FIG. 3 is a diagram illustrating an example of a cross section of the lower electrode LE along a line X1-X1 of FIG. 2. On the cross section shown in FIG. 3, the multiple pipes PP (that is, the multiple discharge holes JO) are substantially equi-spaced in a circumferential direction and a diametrical direction of a circular cross section of the first plate 18a when viewed from above the placing surface FA. As illustrated in FIG. 3, when viewed from above the placing surface FA, the multiple pipes PP (that is, the multiple discharge holes JO) are provided to be dispersed within the placing surface FA.

Reference is made back to FIG. 2. The chiller unit CH is connected to the heat exchange unit HE via the supply line SL of the coolant and the drain line DLd of the coolant. The chiller unit CH supplies the coolant to the heat exchange unit HE through the supply line SL and drains the coolant from the heat exchange unit HE through the drain line DLd.

The chiller unit CH includes a pressure gauge PRLd, a check valve CVLd, an expansion valve EVLd, a regulation valve AV, a compressor CM, a condenser CD, an expansion valve EVC and a pressure gauge PRC. The evaporation chamber VP is provided in the second plate 18b, and the reservoir chamber RT is provided in the first plate 18a.

More specifically, the supply line SL connects the condenser CD and the reservoir chamber RT, and the drain line DLd connects the condenser CD and the evaporation chamber VP.

In the chiller unit CH, the expansion valve EVC and the pressure gauge PRC are provided at the supply line SL in series in this sequence from the condenser CD side. In the chiller unit CH, the compressor CM, the regulation valve AV, the expansion valve EVLd, the check valve CVLd, and the pressure gauge PRLd are provided at the drain line DLd in series in this sequence from the condenser CD side.

An outlet of the condenser CD is connected to an inlet of the expansion valve EVC, and an outlet of the expansion valve EVC is connected to an inlet of the pressure gauge PRC. An outlet of the pressure gauge PRC is connected to the reservoir chamber RT.

An inlet of the condenser CD is connected to an outlet of the compressor CM, and an inlet of the compressor CM is connected to an outlet of the regulation valve AV. An inlet of the regulation valve AV is connected to an outlet of the expansion valve EVLd, and an inlet of the expansion valve EVLd is connected to an outlet of the check valve CVLd.

An inlet of the check valve CVLd is connected to an outlet of the pressure gauge PRLd, and an inlet of the pressure gauge PRLd is connected to the drain line DLd. The drain line DLd is connected to a liquid accumulation region VPL extended downwards below the discharge holes JO in the evaporation chamber VP. The liquid accumulation region VPL is a region within the evaporation chamber VP ranging from a surface of a bottom wall SFa exposed within the evaporation chamber VP to the discharge holes JO, and is a space in which, in the coolant discharged from the discharge holes JO, the coolant in the liquid phase (coolant as the liquid) can be accumulated (this definition is valid throughout the specification). Further, within the evaporation chamber VP, a region except the liquid accumulation region VPL includes a gas diffusion region VPA. The gas diffusion region VPA is extended upwards from the discharge holes JO in the evaporation chamber VP, and is a space in which, in the coolant discharged from the discharge holes JO, the coolant in the gas phase (coolant as the gas) can be diffused (this definition is valid throughout the specification).

The openness degree (%) of each of the expansion valve EVC, the regulation valve AV, the expansion valve EVLd, the check valve CVLd is controlled by the control unit Cnt.

Figure 4:
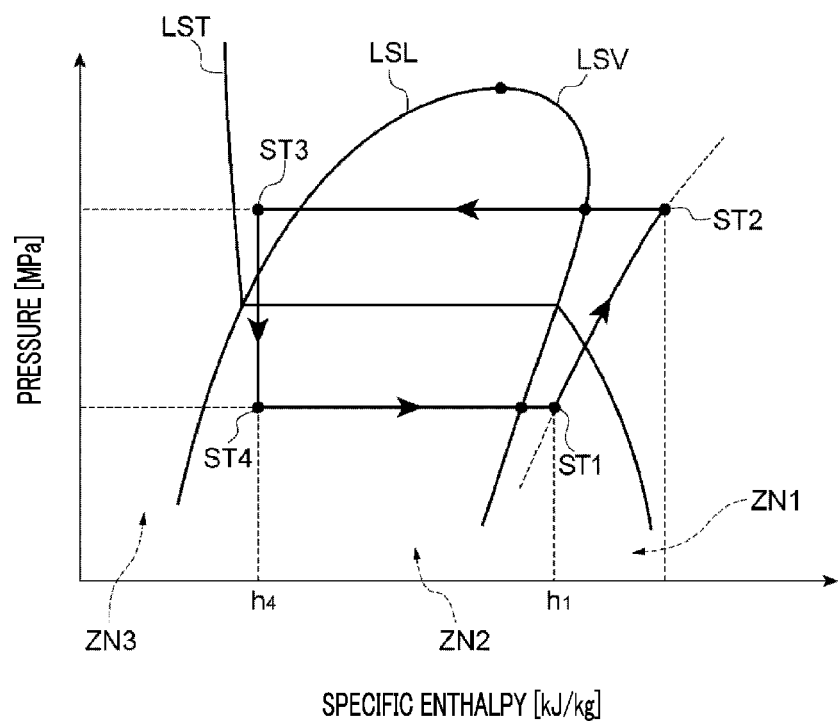
FIG. 4 provides a Ph chart (Mollier chart) showing a refrigeration cycle of the cooling system according to the present disclosure.
Figure 5:
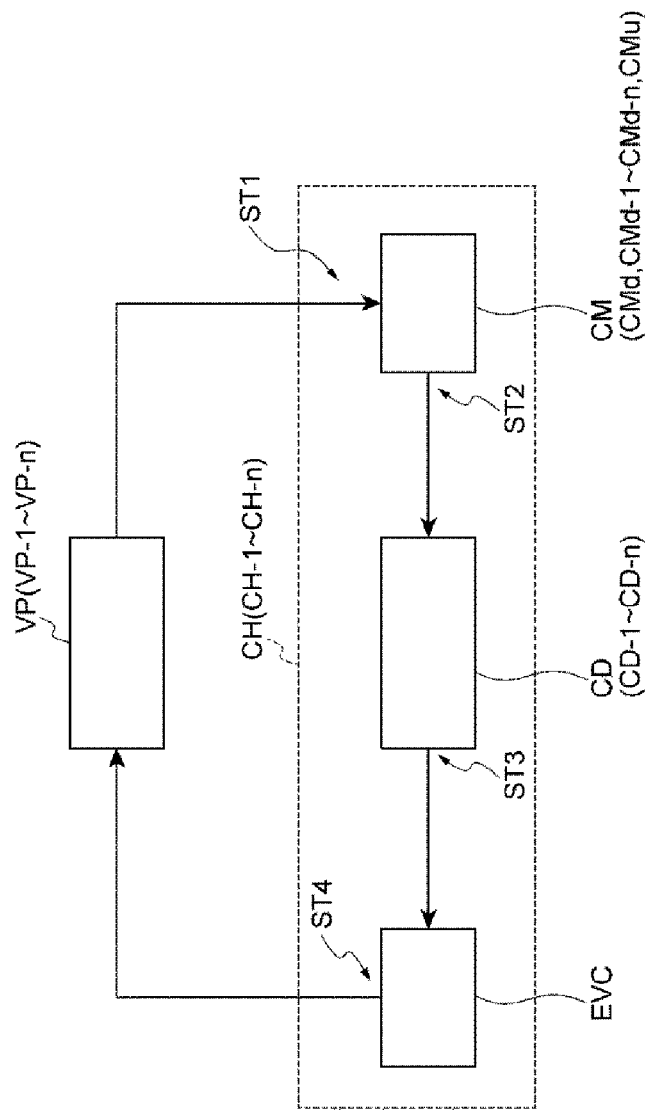
FIG. 5 is a diagram for, along with FIG. 4, describing the refrigeration cycle of the cooling system according to the present disclosure.

Referring to FIG. 4 and FIG. 5, a refrigeration cycle of the cooling system CS will be explained. FIG. 4 is a Ph chart (Mollier chart) showing the refrigeration cycle of the cooling system CS. FIG. 5 is a diagram for describing the refrigeration cycle of the cooling system CS along with FIG. 4.

First, the coolant drained from the evaporation chamber VP (or the branch chambers VP-1 to VP-n shown in FIG. 6, FIG. 11 and FIG. 13) of the heat exchange unit HE comes into a state ST1 when it reaches the inlet of the compressor CM (or a compressor CMd shown in FIG. 10, compressors CMd-1 to CMd-n shown in FIG. 6, FIG. 11 and FIG. 13 or a compressor CMu shown in FIG. 11). The state ST1 is within a superheated vapor zone ZN1. The coolant is compressed along the constant specific entropy line by the compressor CM and comes into a state ST2 when it reaches the outlet of the compressor CM. The state ST2 is within the superheated vapor zone ZN1.

A state of the coolant discharged from the compressor CM crosses a saturated vapor line LSV and a saturated liquid line LSL while being condensed by the condenser CD (or condensers CD-1 to CD-n shown in FIG. 13) along an isobar, and comes into a state ST3 when it reaches the outlet of the condenser CD. The state ST3 is within a supercooling zone ZN3. A state of the coolant discharged from the condenser CD crosses the saturated liquid line LSL while being expanded by the expansion valve EVC along a constant specific enthalpy line and comes into a state ST4 when it reaches the outlet of the expansion valve EVC. The state ST4 is within a wet vapor zone ZN2.

On the Ph diagram shown in FIG. 4, an isotherm is drawn at a typical interval of 10° C. over the supercooling zone ZN3, the wet vapor zone ZN2 and the superheated vapor zone ZN1. The isotherm LST shown in FIG. 4 is extended as a nearly vertical curve coming downwards to the right with a rise of the specific enthalpy in the supercooling zone ZN3; bent at a point of intersection with the saturated liquid line LSL and extended as a horizontal straight line (line with a constant pressure) in the wet vapor zone ZN2; and bent again at a point of intersection with the saturated vapor line LSV and extended as a curve coming downwards to the right in the superheated vapor zone ZN1. The isotherm LST shown in FIG. 4 is an example of such an isotherm. The coolant in the wet vapor zone ZN2 is in a state in the middle of the vaporization process or the condensation process, and includes therein a saturated liquid and a saturated vapor. In this refrigeration cycle, the pressure and the temperature are maintained constant in the evaporation process or the condensation process.

The coolant in a low-pressure and low-temperature wet vapor state (state ST4) discharged from the expansion valve EVC crosses the saturated vapor line LSV while being evaporated along the isobar by depriving heat from the heat transfer wall SF in the evaporation chamber VP and reaches the outlet of the evaporation chamber VP. In the saturated state of the theoretical refrigeration cycle, if the pressure of the coolant is designated, a saturation temperature is decided, and if the temperature of the coolant is designated, a saturation pressure is decided. That is, an evaporating temperature of the coolant can be controlled by adjusting the pressure of the coolant.

In the vaporization chamber VP, the specific enthalpy of the coolant increases from h4 up to h1 during an isothermal change (from ST4 to ST1). A heat amount Wr (kJ/kg) deprived by 1 kg of the coolant from a non-cooling object (heat transfer wall), which is provided nearby, is called a refrigeration effect. This heat amount is equal to a heat amount received by 1 kg of the coolant from the non-cooling object and becomes equal to an increment (h1−h4) (kJ/kg) of the specific enthalpy of the coolant from the inlet of the evaporation chamber VP to the outlet thereof. Thus, there is established a relationship of Wr=h1−h4.

A refrigeration capacity φ0 (kJ/s) (or (kW)) is calculated as a product of the heat amount Wr (kJ/kg) as the refrigeration effect and a coolant circulation amount Qmr (kg/s).

$$\phi 0 = Qmr \times Wr = Qmr \times (h1-h4)$$

Here, Wr, h1 and h4 are defined as follows:
Wr: refrigeration effect (kJ/kg)
h1: specific enthalpy (kJ/kg) of the coolant (superheated vapor) at the outlet of the evaporation chamber VP
h4: specific enthalpy (kJ/kg) of the coolant (wet vapor) at the inlet of the evaporation chamber VP.

Further, a capacity whereby a cooling target object can be cooled by the cooling system CS is referred to as the "refrigeration capacity." Thus, the refrigeration capacity is proportional to the refrigeration effect of the coolant and the coolant circulation amount. Further, even if the evaporation chamber VP is divided into the branch chambers VP-1 to VP-n, the cooling capacities of the individual branch chambers VP-1 to VP-n can be controlled by adjusting the coolant circulation amount.

The cooling system CS performs the heat exchange in the evaporation chamber VP by the circulation of the coolant in the above-described refrigeration cycle shown in FIG. 4 and FIG. 5. The refrigeration cycle shown in FIG. 4 and FIG. 5 are realized in the following second to fifth embodiments in the same manner as in the first exemplary embodiment.

Second Exemplary Embodiment

FIG. 6 is a diagram illustrating a configuration of a cooling system CS according to a second exemplary embodiment. In the cooling system CS according to the second exemplary embodiment, the evaporation chamber VP and the reservoir chamber RT of the first exemplary embodiment are changed.

An evaporation chamber VP of the cooling system CS according to the second exemplary embodiment includes a plurality of first branch chambers (branch chambers VP-1 to VP-n) (n denotes an integer equal to or larger than 2 throughout the following description). The branch chambers VP-1 to VP-n are spaced apart from each other within the second plate 18*b* of the placing table PD. The first branch chambers (branch chambers VP-1 to VP-n) respectively include discharge holes JO, and are provided to be dispersed within the placing surface FA when viewed from above the placing surface FA.

A reservoir chamber RT of the cooling system CS according to the second exemplary embodiment includes a plurality of second branch chambers (branch chambers RT-1 to RT-n). The branch chambers RT-1 to RT-n are spaced apart from each other within the first plate 18*a* of the placing table PD. The second branch chambers (branch chambers RT-1 to RT-n) communicate with the first branch chambers via pipes PP, respectively.

A drain line DLd is equipped with a plurality of first branch lines (branch lines DLd-1 to DLd-n). The branch lines DLd-1 to DLd-n are respectively connected to the branch chambers VP-1 to VP-n of the evaporation chamber VP, respectively.

A supply line SL is equipped with a plurality of second branch lines (branch lines SL-1 to SL-n). One end of the supply line SL is connected to a condenser CD of a chiller unit CH according to the second exemplary embodiment. The other end of the supply line SL is provided with the branch lines SL-1 to SL-n. That is, the supply line SL extended from the chiller unit CH of the second exemplary embodiment is branched into the branch lines SL-1 to SL-n. The branch lines SL-1 to SL-n are respectively connected to the branch chambers RT-1 to RT-n of the reservoir chamber RT.

The chiller unit CH according to the second exemplary embodiment is equipped with a pressure gauge PRC and an expansion valve EVC. The pressure gauge PRC and the expansion valve EVC are provided at the supply line SL. At the supply line SL, the expansion valve EVC is positioned between the condenser CD and the pressure gauge PRC.

The chiller unit CH according to the second exemplary embodiment is equipped with a plurality of pressure gauges PRLd (pressure gauges PRLd-1 to PRLd-n), a plurality of check valves CVLd (check valves CVLd-1 to CVLd-n), a plurality of expansion valves EVLd (expansion valves EVLd-1 to EVLd-n), a plurality of regulation valves AV (regulation valves AVd-1 to AVd-n), and a plurality of compressors CM (compressors CMd-1 to CMd-n).

The compressors CMd-1 to CMd-n are respectively provided at the branch lines DLd-1 to DLd-n. The regulation valves AVd-1 to AVd-n are respectively provided at the branch lines DLd-1 to DLd-n.

The expansion valves EVLd-1 to EVLd-n are respectively provided at the branch lines DLd-1 to DLd-n. The check valves CVLd-1 to CVLd-n are respectively provided at the branch lines DLd-1 to DLd-n. The pressure gauges PRLd-1 to PRLd-n are respectively provided at the branch lines DLd-1 to DLd-n.

The condenser CD according to the second exemplary embodiment is connected to each of the compressors CMd-1 to CMd-n. The compressors CMd-1 to CMd-n are respectively connected to the regulation valves AVd-1 to AVd-n. The regulation valves AVd-1 to AVd-n are respectively connected to the expansion valves EVLd-1 to EVLd-n.

The expansion valves EVLd-1 to EVLd-n are respectively connected to the check valves CVLd-1 to CVLd-n. The check valves CVLd-1 to CVLd-n are respectively connected to the pressure gauges PRLd-1 to PRLd-n. The pressure gauges PRLd-1 to PRLd-n are respectively connected to the branch chambers VP-1 to VP-n.

At the supply line SL, the pressure gauge PRC of the chiller unit CH according to the second exemplary embodiment is connected to a flow rate control valve FCV. The flow rate control valve FCV is connected to the chiller unit CH according to the second exemplary embodiment and the branch lines SL-1 to SL-n.

At the supply line SL, the flow rate control valve FCV is provided between the chiller unit CH and the branch lines SL-1 to SL-n.

The branch lines SL-1 to SL-n are respectively provided with flow rate control valves FCV-1 to FCV-n and pressure gauges PRC-1 to PRC-n. For example, the flow rate control valve FCV-1 and the pressure gauge PRC-1 are provided at the branch line SL-1, and the flow rate control valve FCV-n and the pressure gauge PRC-n are provided on the branch line SL-n.

Each of the flow rate control valves FCV-1 to FCV-n is connected to the flow rate control valve FCV. The pressure gauges PRC-1 to PRC-n are respectively connected to the flow rate control valves FCV-1 to FCV-n. The branch chambers RT-1 to RT-n are respectively connected to the pressure gauges PRC-1 to PRC-n.

The flow rate control valves FCV-1 to FCV-n are provided between the flow rate control valve FCV and the pressure gauges PRC-1 to PRC-n, respectively. The pressure gauges PRC-1 to PRC-n are provided between the flow rate control valves FCV-1 to FCV-n and the branch chambers RT-1 to RT-n, respectively.

In the second exemplary embodiment, a flow rate of the coolant supplied to the evaporation chamber VP (each of the branch chambers VP-1 to VP-n) through the supply line SL from the chiller unit CH is entirely first adjusted as the openness degree (%) of the flow rate control valve FCV is controlled. Then, by adjusting the openness degree (%) of each of the flow rate control valves FCV-1 to FCV-n, flow rates of the coolant in the respective branch lines SL-1 to SL-n (that is, flow rates of the coolant respectively supplied into the branch chambers RT-1 to RT-n) can be adjusted individually.

The openness degree (%) of each of the flow rate control valve FCV, the flow rate control valves FCV-1 to FCV-n, the regulation valves AVd-1 to AVd-n, the expansion valves EVLd-1 to EVLd-n, and the check valves CVLd-1 to CVLd-n is controlled by the control unit Cnt.

Figure 7:
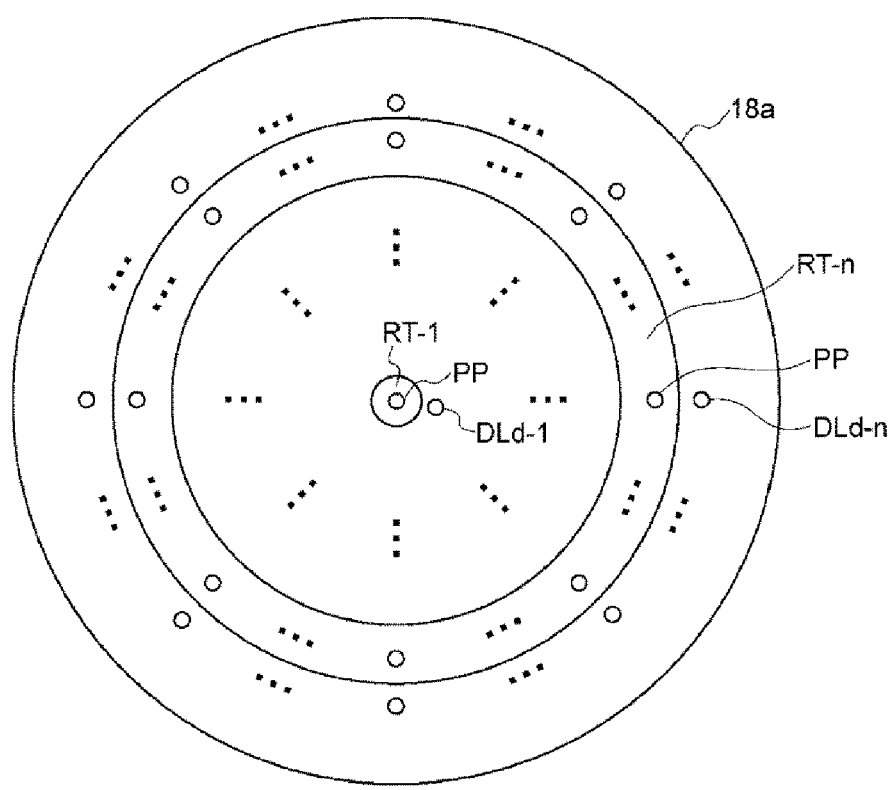
FIG. 7 is a diagram illustrating an example of a cross section of a lower electrode taken along a line X2-X2 of FIG. 6.
Figure 8:
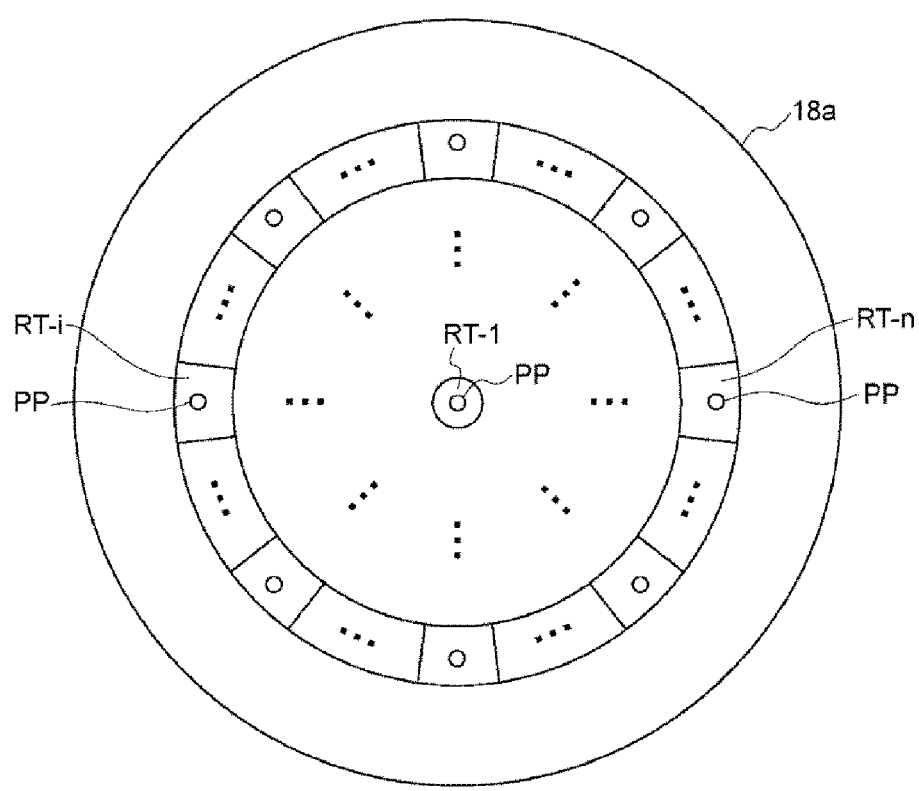
FIG. 8 is a diagram illustrating another example of the cross section of the lower electrode taken along the line X2-X2 of FIG. 6.

FIG. 7 is a diagram illustrating an example of a cross section of the lower electrode LE taken along a line X2-X2 of FIG. 6. FIG. 8 is a diagram illustrating another example of the cross section of the lower electrode LE taken along the line X2-X2 of FIG. 6.

As depicted in FIG. 7, the branch chambers RT-1 to RT-n are spaced apart from each other. On the cross section shown in FIG. 7, the branch chambers RT-1 to RT-n are arranged in sequence outwards in a diametrical direction from a center of a circular cross section of the first plate 18a, when viewed from above the placing surface FA. On the cross section shown in FIG. 7, the branch chamber RT-1 has a circular cross section and the branch chambers arranged at an outer side than the branch chamber RT-1 (for example, the branch chamber RT-n) have a strip-shaped cross section, when viewed from above the placing surface FA.

As depicted in FIG. 7, when viewed from above the placing surface FA, the multiple pipes PP (that is, the multiple discharge holes JO) are arranged while being dispersed within the placing surface FA. As can be seen from FIG. 7, the drain line DLd (the branch lines DLd-1 to DLd-n) connected to the branch chamber (branch chambers VP-1 to VP-n) communicating with a corresponding pipe PP is placed in the vicinity of the pipe PP.

Further, the branch chamber arranged at the outer side than the branch chamber RT-1 (for example, branch chamber RT-i, branch chamber RT-n; i denotes an integer within a range of 1<i<n) may not be limited to having the strip-shaped cross section shown in FIG. 7. By way of example, this branch chamber may have a cross section in which the corresponding strip-shaped cross section is divided in plural along the circumference thereof and the divided cross-sections are spaced apart from each other, as shown in FIG. 8.

FIG. 9 is a diagram for describing an example operation of the cooling system CS shown in FIG. 6. Operations (operations PT1 to PT3) shown in FIG. 9 may also be applicable to cooling systems CS shown in FIG. 11 and FIG. 13 (the fourth exemplary embodiment and the fifth exemplary embodiment) to be described later.

The operations shown in FIG. 9 can be controlled by the control unit Cnt. The operations shown in FIG. 9 are operations of the flow rate control valves FCV-1 to FCV-n, and are operations for changing the openness degree (%) of each of the flow rate control valves FCV-1 to FCV-n with a lapse of time such as a period T1, a period T2, and so forth. For example, the period T2 is a time period following the period T1. In each period such as the period T1, a sum of the openness degree (%) of the respective flow rate control valves FCV-1 to FCV-n is 100%.

The operation PT1 is an operation for changing the openness degree (%) of each of the flow rate control valves FCV-1 to FCV-n with a lapse of time such as the period T1, the period T2, and so forth. By way of example, in the operation PT1, from a state in which the openness degree (%) of the flow rate control valve FCV-1 is set to be 30% and the openness degree (%) of the flow rate control valve FCV-n is set to be 10% in the period T1, the openness degree (%) of the flow rate control valve FCV-1 is changed to 20% and the openness degree (%) of the flow rate control valve FCV-n is changed to 5% in the period T2 following the period T1.

The operation PT2 is an operation of fixing the openness degree (%) of each of the flow rate control valves FCV-1 to FCV-n in all periods (the period T1 and so forth). By way of example, in the operation PT2, the openness degree (%) of the flow rate control valve FCV-1 is fixed to 50%, and the openness degree (%) of the flow rate control valve FCV-n is fixed to 20% in all periods (the period T1 and so forth). In this way, by fixing the openness degree of each flow rate control valve and adjusting the coolant circulation amount, the refrigeration capacity of each branch chamber can be controlled as required even when a heat input is not uniform in the plasma processing. The operation PT2 is a specific example of the operation PT1.

The operation PT3 is an operation for setting the openness degree (%) of only one of the flow rate control valves FCV-1 to FCV-n to 100% in each period such as the period T1, the period T2, and so forth. By way of example, in the operation PT3, the openness degree (%) of the flow rate control valve FCV-1 is set to be 100% in the period T1, and the openness degree (%) of the flow rate control valve FCV-n is set to be 100% in the period T2 following the period T1. In this way, by adjusting a coolant supply time with respect to the branch chamber to be subjected to the temperature control, the refrigeration capacity of each branch chamber can be controlled as required even when the heat input is not uniform in the plasma processing. The operation PT3 is a specific example of the operation PT1.

Third Exemplary Embodiment

FIG. 10 is a diagram illustrating a configuration of a cooling system CS according to a third exemplary embodiment. The cooling system CS according to the third exemplary embodiment has a drain line DLu (second drain line) in addition to the configuration of the first exemplary embodiment.

The drain line DLu is configured to connect an evaporation chamber VP and a chiller unit CH. To be more specific, the drain line DLu connects the evaporation chamber VP and a condenser CD of the chiller unit CH and is connected to a gas diffusion region VPA of the evaporation chamber VP which is upwardly extended above discharge holes JO.

The chiller unit CH according to the third exemplary embodiment is further equipped with a pressure gauge PRLu, a check valve CVLu, an expansion valve EVLu, a regulation valve AVu and a compressor CMu. The compressor CMu, the regulation valve AVu, the expansion valve EVLu, the check valve CVLu and the pressure gauge PRLu are provided at the drain line DLu.

The condenser CD according to the third exemplary embodiment is connected to the compressor CMu. The compressor CMu is connected to the regulation valve AVu. The regulation valve AVu is connected to the expansion valve EVLu. The expansion valve EVLu is connected to the check valve CVLu. The check valve CVLu is connected to the pressure gauge PRLu. The pressure gauge PRLu is connected to the evaporation chamber VP.

The pressure gauge PRLu, the check valve CVLu, the expansion valve EVLu, the regulation valve AVu and the compressor CMu have the same functions as those of the pressure gauge PRLd, the check valve CVLd, the expansion valve EVLd, the regulation valve AVd and the compressor CMd, respectively.

An openness degree (%) of each of the regulation valve AVu, the expansion valve EVLu and the check valve CVLu is controlled by the control unit Cnt.

Fourth Exemplary Embodiment

FIG. 11 is a diagram illustrating a configuration of a cooling system CS according to a fourth exemplary embodiment. The cooling system CS according to the fourth exemplary embodiment has a drain line DLu in addition to the configuration of the second exemplary embodiment. The drain line DLu according to the fourth exemplary embodiment is equipped with branch lines DLu-1 to DLu-n.

The branch lines DLu-1 to DLu-n are respectively connected to branch chambers VP-1 to VP-n. The branch lines DLu-1 to DLu-n are respectively provided with check valves CVLu-1 to CVLu-n.

The check valves CVLu-1 to CVLu-n may be provided within the first plate 18a or at an outside of the lower electrode LE. An openness degree (%) of each of the check valves CVLu-1 to CVLu-n is controlled by the control unit Cnt.

The branch chambers VP-1 to VP-n are connected to a reservoir chamber RK provided in the first plate 18a via the branch lines DLu-1 to DLu-n, respectively, and the reservoir chamber RK is connected to a chiller unit CH via the drain line DLu. The drain line DLu (including the branch lines DLu-1 to DLu-n) connects, via the reservoir chamber RK, each of the branch chambers VP-1 to VP-n to the chiller unit CH according to the fourth exemplary embodiment.

The coolant discharged from the branch chambers VP-1 to VP-n is stored in the reservoir chamber RK via the branch lines DLu-1 to DLu-n, respectively, and the coolant stored in the reservoir chamber RK is sent from the reservoir chamber RK into the chiller unit CH via the drain line DLu connected to the reservoir chamber RK.

The chiller unit CH according to the fourth exemplary embodiment is further equipped with, the same as in the third exemplary embodiment, a pressure gauge PRLu, a check valve CVLu, an expansion valve EVLu, a regulation valve AVu and a compressor CMu connected to the drain line DLu. The pressure gauge PRLu, the check valve CVLu, the expansion valve EVLu, the regulation valve AVu and the compressor CMu according to the fourth exemplary embodiment are the same as those of the third exemplary embodiment.

Figure 12:
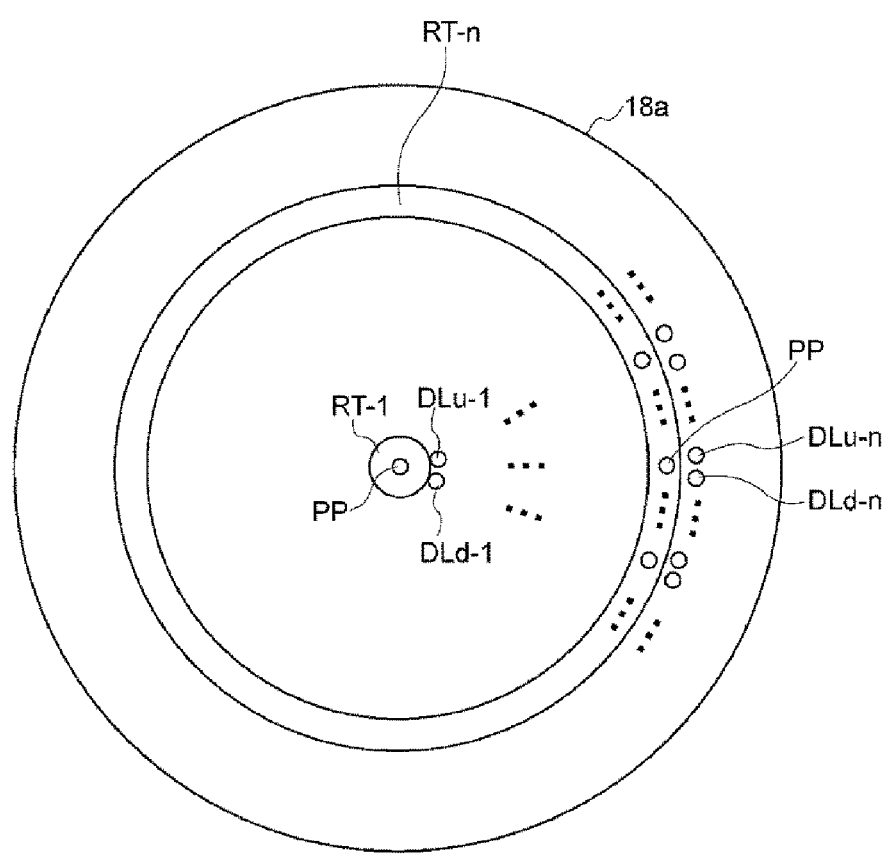
FIG. 12 is a diagram illustrating an example of a cross section of a lower electrode taken along the line X3-X3 of FIG. 11.

FIG. 12 is a diagram illustrating an example of a cross section of the lower electrode LE taken along a line X3-X3 of FIG. 11. As shown in FIG. 12, in the fourth exemplary embodiment, a shape and an arrangement of the branch chambers RT-1 to RT-n, an arrangement of the pipes PP, and an arrangement of the branch lines DLd-1 to DLd-n are the same as those of the second exemplary embodiment shown in FIG. 7.

As depicted in FIG. 12, in the fourth exemplary embodiment, the drain line DLu (the branch lines DLu-1 to DLu-n) connected to the branch chamber (branch chambers VP-1 to VP-n) communicating with a corresponding pipe PP is placed in the vicinity of the corresponding pipe PP.

Fifth Exemplary Embodiment

FIG. 13 is a diagram illustrating a configuration of a cooling system CS according to a fifth exemplary embodiment. The cooling system CS according to the fifth exemplary embodiment has a plurality of chiller units (chiller units CH-1 to CH-n). Each of the chiller units CH-1 to CH-n has the same function as that of the chiller unit CH according to the second exemplary embodiment. Particularly, each of the chiller units CH-1 to CH-n (for example, the chiller unit CH-1) supplies the coolant into and drains the coolant from a single set of a second branch chamber and a first branch chamber communicating with each other (for example, a branch chamber RT-1 and a branch chamber VP-1 connected to the chiller unit CH-1).

The chiller units CH-1 to CH-n are respectively provided with condensers CD-1 to CD-n. Each of the condensers CD-1 to CD-n according to the fifth exemplary embodiment has the same function as that of the condenser CD according to the first exemplary embodiment to the fourth exemplary embodiment.

Branch lines SL-1 to SL-n are respectively connected to branch chambers RT-1 to RT-n and respectively connected to the condensers CD-1 to CD-n. For example, the branch line SL-1 connects the branch chamber RT-1 to the condenser CD-1 of the chiller unit CH-1.

Branch lines DLd-1 to DLd-n are respectively connected to branch chambers VP-1 to VP-n and respectively connected to the condensers CD-1 to CD-n. For example, the branch line DLd-1 connects the branch chamber VP-1 and the condenser CD-1 of the chiller unit CH-1.

Each of the chiller units CH-1 to CH-n is provided with an expansion valve EVC and a pressure gauge PRC.

The chiller units CH-1 to CH-n are respectively equipped with compressors CMd-1 to CMd-n and regulation valves AVd-1 to AVd-n.

The chiller units CH-1 to CH-n are equipped with expansion valves EVLd-1 to EVLd-n, check valves CVLd-1 to CVLd-n, and pressure gauges PRLd-1 to PRLd-n, respectively.

The condensers CD-1 to CD-n are respectively connected to the expansion valves EVC and the compressors CMd-1 to CMd-n.

The same as in the second exemplary embodiment, the cooling system CS according to the fifth exemplary embodiment is equipped with flow rate control valves FCV-1 to FCV-n and pressure gauges PRC-1 to PRC-n. The flow rate control valves FCV-1 to FCV-n are respectively provided at the branch lines SL-1 to SL-n. The pressure gauges PRC-1 to PRC-n are respectively provided at the branch lines SL-1 to SL-n. The flow rate control valves FCV-1 to FCV-n are provided between the chiller units CH-1 to CH-n and the pressure gauges PRC-1 to PRC-n, respectively. The pressure gauges PRC-1 to PRC-n are provided between the flow rate control valves FCV-1 to FCV-n and the branch chambers RT-1 to RT-n, respectively. By adjusting openness degree (%) of the respective flow rate control valves FCV-1 to FCV-n, flow rates of the coolant supplied into the branch chambers RT-1 to RT-n from the chiller units CH-1 to CH-n, respectively, can be adjusted.

Figure 14:
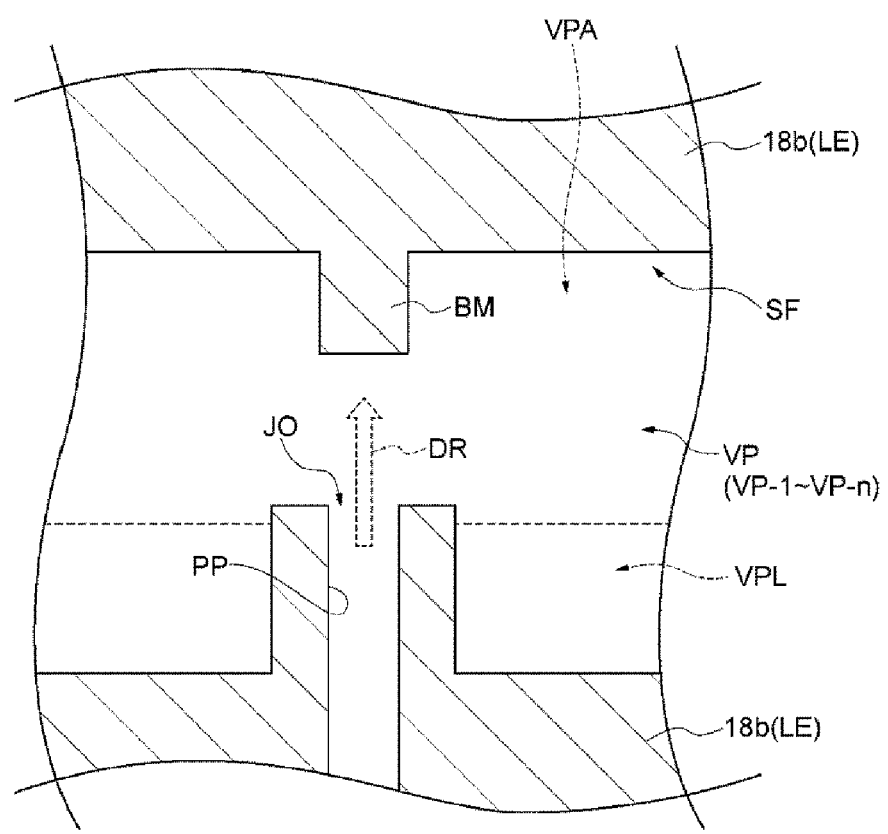
FIG. 14 is a diagram illustrating a major configuration of an evaporation chamber included in the cooling systems of FIG. 2, FIG. 10, FIG. 6, FIG. 11 and FIG. 13.

FIG. 14 is a diagram illustrating a major configuration of the evaporation chamber VP (and the branch chambers VP-1 to VP-n) provided in the cooling system CS shown in each of FIG. 2, FIG. 10, FIG. 6, FIG. 11 and FIG. 13. Multiple protrusions BM are provided at the heat transfer wall SF of the evaporation chamber VP. A protrusion BM is provided at the heat transfer wall SF of each of the branch chambers VP-1 to VP-n. Each protrusion BM is provided as one body with the heat transfer wall SF and has relatively high thermal conductivity, the same as the heat transfer wall SF.

The discharge hole JO of the pipe PP is provided to face the protrusion BM. The coolant is discharged from the discharge hole JO in a discharging direction DR to reach the protrusion BM. The coolant discharged to the protrusion BM can receive heat from the protrusion BM and the heat transfer wall SF. The heat of the protrusion BM and the heat transfer wall SF is transferred to the coolant discharged to the protrusion BM, so that the heat can be released from the placing surface FA by the coolant.

Further, in addition to the aforementioned configuration where the protrusion BM is provided at the heat transfer wall SF, in order to achieve the same effect as that in the case of providing the protrusion BM, it may be possible to adopt a configuration in which a column-shaped pin (having a diameter ranging from 1.0 mm to 5.0 mm and a height ranging from 1.0 mm to 5.0 mm) is provided at the heat transfer wall SF; a configuration in which a dimple (having a diameter ranging from 1.0 mm to 5.0 mm and a depth ranging from 1.0 mm to 5.0 mm) is provided at the heat transfer wall SF; a configuration in which a surface roughness of the heat transfer wall SF is increased to have a Ra of 6.3 μm and a Rz of 25 μm; a configuration in which a surface processing is performed on the surface of the heat transfer wall SF to have a porous shape by thermal spraying or the like, and so forth.

In case that the column-shape pin is provided at the heat transfer wall SF and in case that the dimple is provided at the heat transfer wall SF, a portion to which the coolant is discharged is further narrowed (further miniaturized) as compared to the case that the protrusion BM is provided, spatial resolution is improved. In case of increasing the surface roughness of the heat transfer wall SF and in case of performing the surface processing on the surface of the heat transfer wall SF to have the porous shape thereto by thermal spraying or the like, particularly, a surface area of the portion to which the coolant is discharged is increased as compared to that of the protrusion BM, so that the thermal conductivity is increased.

According to the configurations of the cooling systems CS of the first exemplary embodiment to the fifth exemplary embodiment, since the multiple discharge holes JO from which the coolant is discharged to the heat transfer wall SF of the heat exchange unit HE are provided to be dispersed within the placing surface FA when viewed from above the placing surface FA, the coolant can be uniformly discharged toward the heat transfer wall SF regardless of place, when viewed from above the placing surface FA. Therefore, the in-surface non-uniformity in the heat release upon the wafer W placed on the placing surface FA can be reduced.

Since the drain line DLd (including the branch lines DLd-1 to DLd-n) is connected to the liquid accumulation region VPL extended under the discharge holes JO in the evaporation chamber VP (branch chambers VP-1 to VP-n), the coolant accumulated on the bottom wall SFa can be efficiently collected.

Furthermore, since the vaporized coolant has a reduced heat transfer coefficient and mostly does not contribute to the heat exchange, this evaporated coolant may be a factor hampering the heat exchange if it stays. Thus, it is desirable that the vaporized coolant is discharged promptly. For the purpose, since the drain line DLu is provided in the gas diffusion region VPA upwardly extended above the discharge holes JO in the evaporation chamber VP (branch chambers VP-1 to VP-n), the vapor of the coolant existing around the heat transfer wall SF can be collected rapidly.

Further, in case that the evaporation chamber VP and the reservoir chamber RT are respectively divided into the multiple branch chambers (the branch chambers VP-1 to VP-n) and the multiple branch chambers (the branch chambers RT-1 to RT-n) which are spaced apart from each other as in the second exemplary embodiment, the fourth exemplary embodiment and the fifth exemplary embodiment, since the multiple branch chambers are provided to be dispersed within the placing surface FA when viewed from above the placing surface FA, the in-surface non-uniformity in the heat release upon the wafer W placed on the placing surface FA can be reduced.

Moreover, in case that the reservoir chamber RT is divided into the multiple branch chambers RT-1 to RT-n which are spaced apart from each other as in the second exemplary embodiment, the fourth exemplary embodiment and the fifth exemplary embodiment, since the flow rates of the coolant supplied into the respective branch chambers can be adjusted individually, the heat release upon the wafer W is accurately controlled place by place. Accordingly, the in-surface non-uniformity in the heat release upon the wafer W can be further reduced.

Further, in case that the evaporation chamber VP and the reservoir chamber RT are respectively divided into the multiple branch chambers (the branch chambers VP-1 to VP-n) and the multiple branch chambers (the branch chambers RT-1 to RT-n) which are spaced apart from each other as in the second exemplary embodiment, the fourth exemplary embodiment and the fifth exemplary embodiment, since the chiller units CH-1 to CH-n are respectively provided for the branch chambers RT-1 to RT-n of the reservoir chamber RT, and the circulation of the coolant can be performed by the individual chiller units CH-1 to CH-n independently, the heat release upon the wafer W can be more accurately controlled place by place.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A cooling system configured to circulate a coolant under a placing surface of a placing table on which a processing target object is placed, the cooling system comprising:
 a heat exchange unit provided within the placing table and configured to perform a heat exchange by the coolant via the placing surface of the placing table;
 a supply line and a first drain line connected to the heat exchange unit; and
 a chiller unit connected to the heat exchange unit via the supply line and the first drain line,
 wherein the heat exchange unit comprises:
 a reservoir chamber configured to store the coolant supplied from the chiller unit via the supply line, and an evaporation chamber configured to evaporate the coolant stored in the reservoir chamber, wherein the reservoir chamber is connected to the chiller unit via the supply line and communicates with the evaporation chamber via multiple pipes, the evaporation chamber is connected to the chiller unit via the first drain line, extended along the placing surface and includes multiple discharge holes, the multiple discharge holes are respectively provided at one ends of the multiple pipes and arranged such that the coolant is discharged from the multiple pipes toward a heat transfer wall which is an inner wall of the evaporation chamber at a side of the placing surface, the multiple discharge holes are provided to be dispersed within the placing surface, when viewed from above the placing surface, the multiple pipes are protruded from a lower surface of the evaporation chamber such that the multiple discharge holes are formed at a position higher than a liquid accumulation region of the evaporation chamber, the first drain line is connected to the liquid accumulation region of the evaporation chamber.

2. A cooling system configured to circulate a coolant under a placing surface of a placing table on which a processing target object is placed, the cooling system comprising:

a heat exchange unit provided within the placing table and configured to perform a heat exchange by the coolant via the placing surface of the placing table;

a supply line and a first drain line connected to the heat exchange unit and a chiller unit connected to the heat exchange unit via the supply line and the first drain line, wherein the heat exchange unit comprises:

a reservoir chamber configured to store the coolant supplied from the chiller unit via the supply line, and an evaporation chamber configured to evaporate the coolant stored in the reservoir chamber, wherein the reservoir chamber is connected to the chiller unit via the supply line and communicates with the evaporation chamber via multiple pipes, the evaporation chamber is connected to the chiller unit via the first drain line, extended along the placing surface and includes multiple discharge holes, the multiple discharge holes are respectively provided at one ends of the multiple pipes and arranged such that the coolant is discharged from the multiple pipes toward a heat transfer wall which is an inner wall of the evaporation chamber at a side of the placing surface, and the multiple discharge holes are provided to be dispersed within the placing surface, when viewed from above the placing surface, wherein the evaporation chamber includes first branch chambers spaced apart from each other within the placing table, the reservoir chamber includes second branch chambers spaced apart from each other within the placing table, the first branch chambers respectively includes the multiple discharge holes and are provided to be dispersed within the placing surface when viewed from above the placing surface, the second branch chambers communicate with the first branch chambers via the multiple pipes, respectively, the first drain line includes first branch lines, the first branch lines are respectively connected to the first branch chambers, the supply line includes second branch lines, and the second branch lines are respectively connected to the second branch chambers.

3. The cooling system of claim 2, further comprising:

multiple valves respectively provided at the second branch lines; and a control unit configured to control a flow rate of the coolant supplied into each of the second branch chambers by adjusting an openness degree of each of the multiple valves.

4. The cooling system of claim 1, further comprising:

a second drain line, wherein the second drain line connects the evaporation chamber with the chiller unit, and is connected to a gas diffusion space extended above the multiple discharge holes in the evaporation chamber.

5. The cooling system of claim 2, wherein the chiller unit includes multiple chiller units, and each of the multiple chiller units is configured to supply the coolant into and drain the coolant from a single set of the corresponding one of the second branch chambers and the corresponding one of the first branch chambers communicating with each other.

6. The cooling system of claim 2, wherein the first drain line is connected to a liquid accumulation region which is extended downwards below the multiple discharge holes in the evaporation chamber.

7. The cooling system of claim 2, further comprising:

a second drain line, wherein the second drain line connects the evaporation chamber with the chiller unit, and is connected to a gas diffusion space extended above the multiple discharge holes in the evaporation chamber.

8. The cooling system of claim 7, further comprising:

a second reservoir chamber, wherein the second drain line includes third branch lines, the first branch chambers communicate with the second reservoir chamber via the third branch lines, respectively, and the coolant drained from the first branch chambers is stored in the second reservoir chamber via the third branch lines, and the coolant stored in the second reservoir chamber is sent into the chiller unit via the second drain line.

* * * * *